(12) United States Patent
Kwon

(10) Patent No.: US 7,936,888 B2
(45) Date of Patent: May 3, 2011

(54) EQUALIZATION APPARATUS AND METHOD BASED ON AUDIOGRAM

(76) Inventor: Dae-Hoon Kwon, Seoul (KR)

(*) Notice: Subject to any disclaimer, the term of this patent is extended or adjusted under 35 U.S.C. 154(b) by 1036 days.

(21) Appl. No.: 11/666,782

(22) PCT Filed: Mar. 17, 2005

(86) PCT No.: PCT/KR2005/000766
§ 371 (c)(1), (2), (4) Date: May 1, 2007

(87) PCT Pub. No.: WO2006/068345
PCT Pub. Date: Jun. 29, 2006

(65) Prior Publication Data
US 2008/0008070 A1    Jan. 10, 2008

(30) Foreign Application Priority Data

Dec. 23, 2004 (KR) .................. 10-2004-0111229

(51) Int. Cl.
*H03G 5/00* (2006.01)
(52) U.S. Cl. ............... 381/103; 333/28 R; 381/56
(58) Field of Classification Search ........... 381/56, 381/58, 103, 107, 109, 60, 316, 320, 321; 333/28 R; 600/559; 375/229, 230
See application file for complete search history.

(56) References Cited

U.S. PATENT DOCUMENTS

| | | | |
|---|---|---|---|
| 4,038,496 A * | 7/1977 | Feezor | 73/585 |
| 6,408,273 B1 * | 6/2002 | Quagliaro et al. | 704/271 |
| 6,876,750 B2 * | 4/2005 | Allred et al. | 381/314 |
| 7,136,492 B2 * | 11/2006 | Moller | 381/60 |
| 7,822,212 B2 * | 10/2010 | Merline et al. | 381/57 |
| 2010/0303249 A1 * | 12/2010 | Semcken | 381/58 |

FOREIGN PATENT DOCUMENTS

| | | |
|---|---|---|
| JP | 2000-270392 | 9/2000 |
| WO | 98-05150 | 2/1998 |
| WO | 03-091870 | 11/2003 |
| WO | 2004-036954 | 4/2004 |

* cited by examiner

*Primary Examiner* — Xu Mei
(74) *Attorney, Agent, or Firm* — Ladas & Parry LLP

(57) ABSTRACT

Disclosed is an equalization apparatus and method based on audiogram. The equalization method includes the steps of a) outputting a reference sound having reference frequency and intensity for approximate assumption of auditory threshold, b) determining a start sound corresponding to an assumed value of the auditory threshold while calling a sound having intensity different from a prior sound at a sound source memory depending on whether a user has received an answering signal in response to the reference sound, c) outputting a first test sound whose intensity is controlled at a value set prior to the start sound, having the reference frequency, d) calling a test sound having intensity and frequency different from the prior sound at the sound source memory depending on whether the user has received the answering signal, e) storing data on reception of the answering signal of the user in response to the test sound, f) repeating the steps d) to e), g) determining the auditory threshold per previously set frequency band using the reception data of the answering signal, and h) performing equalization depending on the auditory threshold per the determined frequency.

9 Claims, 6 Drawing Sheets

[ 0 : No-answer , 1 : answer ]

EQUALIZATION APPARATUS AND METHOD BASED ON AUDIOGRAM

TECHNICAL FIELD

The present invention relates to an equalization apparatus and method based on audiogram, and more particularly, to an equalization apparatus and method based on audiogram, in which individual audiogram is tested per personal frequency band using self-calibration and a Random Bekesy tracing algorithm, and equalization is performed based on the tested audiogram to obtain an optimal sound and an optimal hearing protection function.

BACKGROUND ART

Statistically, it is assumed that 0.1% to 0.2% per population corresponds to is profound hearing loss that cannot be heard, 1% to 2% per population corresponds to moderate and severe hearing loss, and 10% to 15% corresponds to mild hearing loss. People corresponding to the range of the mild hearing loss have a difficulty in hearing a sound of 20 dB to 40 dB but can make conversation with another people close to them without difficulty. Therefore, most of the people corresponding to the range of the mild hearing loss rarely go to hospital because they do not recognize seriousness of their hearing loss. However, if the people corresponding to the range of the mild hearing loss continuously use an audio player with excessively great volume, their hearing loss may become the moderate hearing loss. In worst case, their hearing loss may become the severe hearing loss or the profound hearing loss.

In modern society, many people use various audio players, such as TV, the AM-FM Radio, CD player, MP3 player, audio cassette, PC, and language player.

The audio players currently selling in the market have a volume amplifying function enough to cause hearing loss. Since most of users of the audio players tend to listen to music with high volume, their hearing loss becomes serious to cause the mild hearing loss. Particularly, since people who much like music tend to listen to music with high volume, those people are more serious in hearing loss to cause moderate hearing loss or profound hearing loss.

The related art audio player has caused more serious hearing loss because it played audio regardless of individual audiogram.

Auditory cells of a cochlear canal have frequency bands and volume, which are determined. Audiogram is a distribution of sense per frequency of the auditory cells, which is obtained by hearing test. People have unique audiogram like fingerprint or DNA structure. Such audiogram may be varied due to aging or excessive great volume. For example, supposing that anyone listened to a sound of a frequency of 1 kHz at the intensity of 80 dBHL or greater for several hours, its particular auditory cell that handles the sound of 1 kHz is exposed to an excessive sound, thereby causing sudden hearing loss. Supposing that anyone who likes a sharp and stimulus sound repeatedly listens to a sound of a frequency of 10 kHz with high volume, its hearing may cause a functional hearing loss for the frequency band of 10 kHz.

Meanwhile, FIG. 1 illustrates the result of volume control of the related art audio player. In FIG. 1, a first group 100 and a second group 102 are shown. The first group 100 has a threshold of 0 dBHL around 1 kHz in an outer hair cell group while the second group 102 has a threshold of 30 dBHL.

Since the related art audio player linearly controls volume, it is likely that the first group 100 may be damaged. In other words, if volume is controlled at 90 dBHL, the second group 102 may feel less fatigue because it is exposed at 60 dBHL. However, the first group 100 may be damaged due to volume distortion and fatigue because it is overexposed at 90 dBHL.

To avoid loss of the auditory cells, which may be caused by linear volume control of the audio player, equalization may be performed to enable individual volume control per frequency band.

Generally, an equalizer allows a user to listen to music at a desired sound tone. For example, anyone who likes a clear and elegant sound can volume the high frequency band of the equalizer up to listen to a desired sound. Anyone who likes a magnificent and powerful sound can volume the low frequency band of the equalizer up to listen to a desired sound.

In addition to making user's desired sound tone, the equalizer is used for medical treatment such as an aural aid and an artificial cochlear canal.

In case of hearing loss patients who need an aural aid or an artificial cochlear canal, the equalizer should essentially be controlled depending on their audiogram after testing their hearing per frequency. This is because that hearing becomes worse if a hearing loss patient having no great hearing loss for a frequency band of 10 kHz is supplied with a sound through an aural aid and an artificial cochlear canal that did not perform equalization (referred to as "fitting" in acoustics) for a frequency band of 10 kHz.

However, if it is intended to provide an audio player based on audiogram of a user using the equalizer, it is difficult to provide such an audio player according to an equalization method based on audiogram in the existing audiogram test method.

In the related art audiogram test method, a particular frequency band is selected by manipulation of a tester based on six frequency bands of 250 Hz, 500 Hz, 1000 Hz, 2000 Hz, 4000 Hz, and 8000 Hz. Afterwards, the intensity of a test sound is manually controlled to determine an auditory threshold in the particular frequency band. In this way, another frequency band is selected to determine its auditory threshold.

In other words, in the related art audiogram test method, since the step of selecting a frequency of the tester, the step of suggesting a test sound, and the step of determining the auditory threshold depending on response of the test sound of a testee are separately performed, maximum time as much as 50 minutes is required to determine the auditory threshold in six frequency bands as above. Therefore, if the related art audiogram test method is applied to the audio player, it is difficult for the user to select the frequency of the audio player, receive the test sound, and determine the auditory threshold.

Particularly, time required for testing the auditory threshold becomes long as a frequency band is subdivided. Therefore, it is difficult to provide the audio player in which equalization is performed based on the related art audiogram test method.

Furthermore, if the test sound is provided by controlling the intensity only in a state that a particular frequency is selected, a test error may greatly occur due to adaptation and selective attention of the user, thereby making exact audiogram test difficult.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Technical Problems

Figure 1:
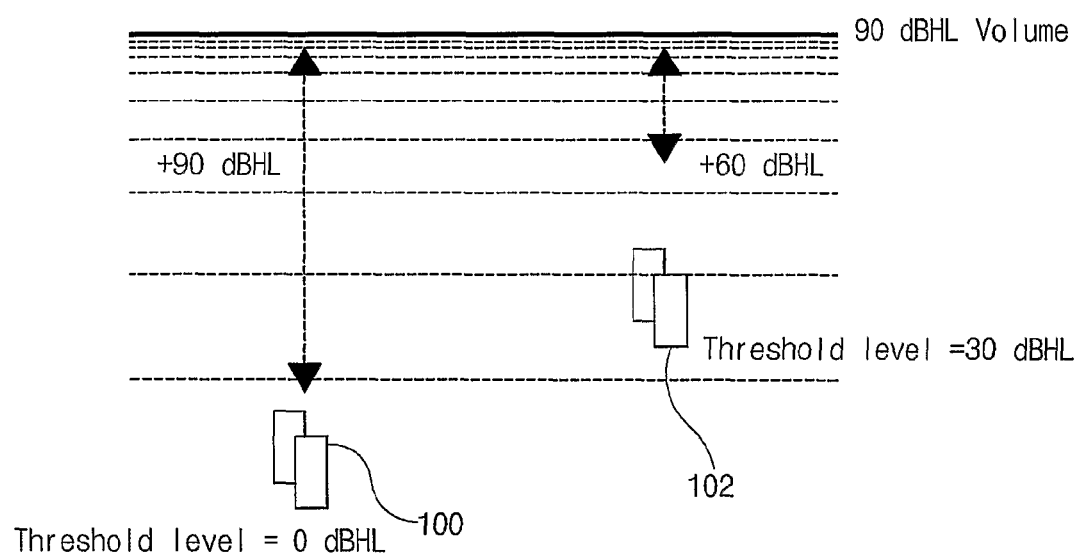
FIG. 1 illustrates the result of volume control of a related art audio player.

Accordingly, the present invention is directed to an equalization apparatus and method based on audiogram that substantially obviates one or more of the problems due to limitations and disadvantages of the related art.

An object of the present invention is to provide an equalization apparatus and method based on audiogram, in which an optimal sound and an optimal hearing protection function can be given to a user while minimizing audiogram test time.

Another object of the present invention is to provide an equalization apparatus and method based on audiogram, in which time required for audiogram test can be minimized even in case that a frequency band is subdivided.

Another object of the present invention is to provide an equalization apparatus and method based on audiogram, in which an optimal test start sound can be set automatically without manual manipulation of a user in selecting the test sound, so as to reduce time required for audiogram test.

Another object of the present invention is to provide an equalization apparatus and method based on audiogram, in which an auditory threshold per frequency band is determined for volume control so that a clear sound may be provided at low power.

Another object of the present invention is to provide an equalization apparatus and method based on audiogram, in which the step of allowing a user to select a frequency is omitted so as not to cause adaptation of hearing or selective attention, thereby enabling exact audiogram test.

Technical Solutions

To achieve these and other advantages and in accordance with the purpose of the present invention, as embodied and broadly described, in an equalization method based on audiogram using an equalization apparatus including a sound source memory calibrated at a constant step of dBHL and storing sound source data having a plurality of frequency bands for one dBHL, a sound chip, a controller calling the sound source data, a speaker, and an equalizer, the equalization method includes the steps of a) outputting a reference sound having reference frequency and intensity for approximate assumption of auditory threshold, b) determining a start sound corresponding to an assumed value of the auditory threshold while calling a sound having intensity different from a prior sound at a sound source memory depending on whether an answering signal of a user to the reference sound is received, c) outputting a first test sound whose intensity is controlled at a value set prior to the start sound, having the reference frequency, d) calling a test sound having intensity and frequency different from those of the prior sound at the sound source memory depending on whether the answering signal of the user to the test sound is received, e) storing reception data on the answering signal of the user to the test sound, f) repeating the steps d) to e), g) determining the auditory threshold per previously set frequency band using the reception data of the answering signal, and h) performing equalization depending on the determined auditory threshold per frequency, wherein the controller calls a sound source while randomly changing the frequency depending on a predetermined Random Bekesy tracing algorithm.

In another aspect of the present invention, an equalization apparatus based on audiogram includes a sound source memory calibrated at a constant step of dBHL and storing sound source data having a plurality of frequency bands for one dBHL, a controller calling a reference sound for approximate assumption of user's auditory threshold and a sound source from the sound source memory during audiogram test, the sound source having intensity and/or frequency controlled depending on whether an answering signal of a user is received, storing reception data on the answering signal of the user to determine user's auditory threshold per frequency band, performing equalization depending on the determined auditory threshold, a sound chip whose output level is controlled at a constant step by an output level control program, receiving an output level changing signal of the controller to change the output level, and an equalizer equalized by the controller, wherein the controller calls the sound source while randomly changing the frequency depending on a predetermined Random Bekesy tracing algorithm.

Applicable Advantages

The equalization apparatus and method based on audiogram according to the present invention has the following advantages.

Since both a sound chip having output intensity controlled at a predetermined step and a sound source file based on an equal loudness contour of ISO226:2003 are is used, audiogram can exactly be tested and time required for setting a first test sound can be reduced.

Further, since a frequency band is randomly changed during audiogram test, adaptation or selective attention for a particular frequency band can be removed to determine exact auditory threshold.

Further, since an audio player is provided in which equalization based on exact and prompt auditory threshold is performed, an optimal sound and an optimal hearing protection function can be given to the user.

Finally, since the auditory threshold is determined per frequency band for volume control, a clear sound can be provided at low power.

BEST MODE FOR CARRYING OUT THE INVENTION

Reference will now be made in detail to the preferred embodiments of the present invention, examples of which are illustrated in the accompanying drawings.

Figure 2:
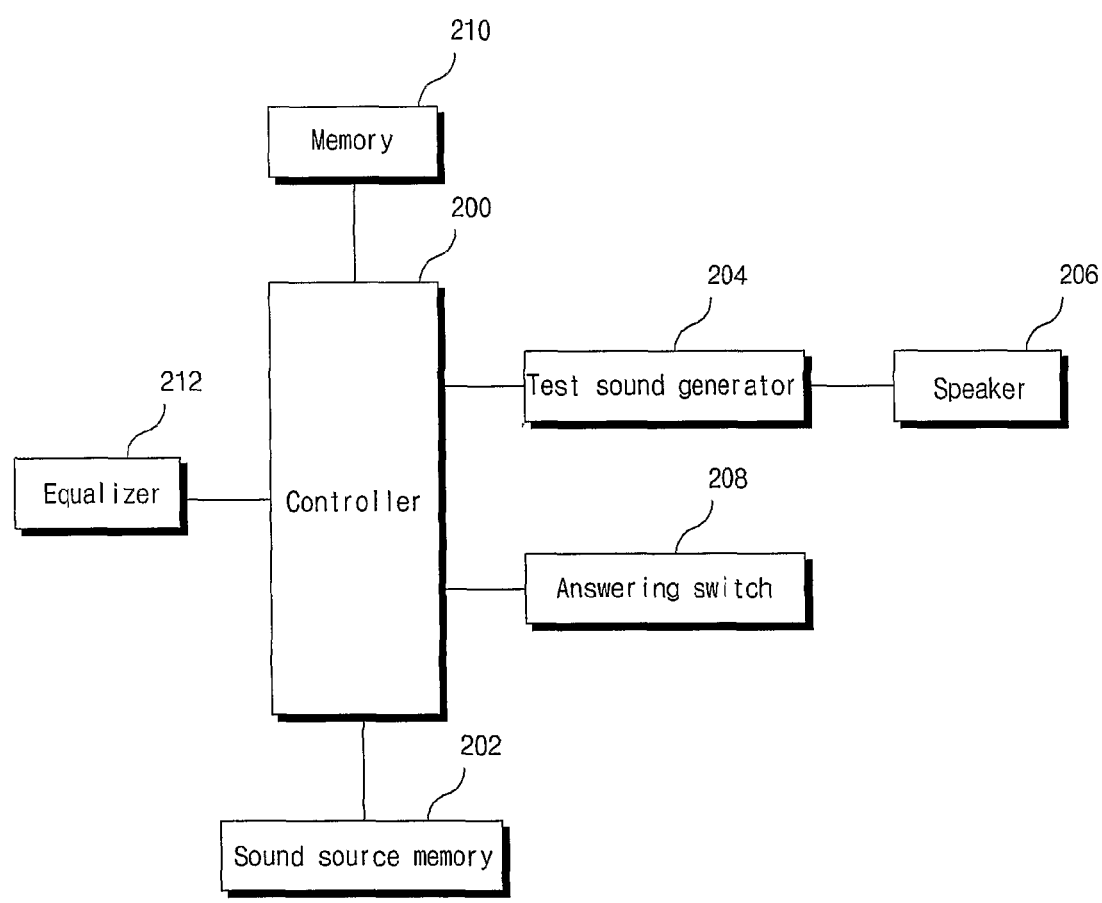
FIG. 2 illustrates an equalization apparatus based on audiogram according to the preferred embodiment of the present invention.

FIG. 2 illustrates an equalization apparatus based on audiogram according to the preferred embodiment of the present invention.

As shown in FIG. 2, an equalization apparatus based on audiogram includes a controller 200, a sound source memory 202, a test sound generator 204, a speaker 206, an answering switch 208, a memory 210, and an equalizer 212.

The controller 200 receives a start signal for testing audiogram of a user and calls a predetermined reference sound from the sound source memory 202 to output the reference sound to the outside through the test sound generator 204 and the speaker 206. A microprocessor may be used as the controller 200.

The controller 200 calls a sound source of different intensity dBHL from the sound source memory 202 depending on whether an answering signal is received from the answering switch 208 while audiogram test continues. Then, the controller 200 processes the received answering signal to determine an auditory threshold of the user.

Particularly, the controller 200 randomly changes a frequency of the sound source depending on a Random Bekesy tracing algorithm to determine the auditory threshold.

The step of determining the auditory threshold will be described later in more detail.

The sound source memory 202 stores the sound source given to the user. In the present invention, a test sound calibrated at a step of 2.5 dBHL is stored in the sound source memory 202 per frequency band.

The test sound generator 204 corresponds to a sound chip, and decodes the sound source called from the sound source memory 202 to output the test sound through the speaker.

The sound source memory 202 and the test sound generator 204 according to the present invention are designed to enable self-calibration in which an optimal test start sound can be selected during audiogram test.

Hereinafter, self-calibration and the Random Bekesy tracing algorithm according to the present invention will be described in more detail.

Self-Calibration

Generally, in a sound chip which uses an AC97 (that is a standardized sound chip built in a main board of a PC in a chip on board type) audio codec and an audio codec similar to the AC97 audio codec, if a volume controller on a control board of the PC is used, it is impossible to finely control the output intensity of the sound chip.

Therefor, the present invention has been intended to control the output intensity of the sound chip at a step of 10 dB based on an AC97 output control algorithm in an application program of the controller 200. Also, the relation between the output level and the output sound pressure has been set as shown in the following Table 1.

TABLE 1

| WAVE OUTPUT LEVEL | dB SPL(sound pressure level) |
|---|---|
| 10000 | 104 |
| 3100 | 94 |
| 1000 | 84 |
| 310 | 74 |
| 100 | 64 |
| 31 | 54 |
| 10 | 44 |
| 1 | 24 |

(Reference Tone = relative intensity of 1 kHz, 0 dB)

Afterwards, a wave file list is prepared, which is calibrated at a step of 2.5 dBHL on the standard of dBHL based on an equal loudness contour of ISO226:2003.

As described above, the test sound calibrated at a step of 2.5 dBHL is stored in the sound source memory 202. At this time, the test sound is preferably stored in a wave file type.

For example, the sound source memory 202 is provided with wave file folders from 50 dBHL to 0 dBHL at a step of 2.5 dBHL. The test sound divided into sound sources per frequency band (for example, 6, 11, 17, and 34 bands) used in audiogram test is stored in each of the wave file folder.

dBHL (dB hearing level) means that a dB sound pressure level (dB SPL), i.e., the physical standard of sound is converted into the psychological acoustic standard. In the present invention, the sound source data is calibrated based on the equal loudness contour of ISO226:2003 finally revised on August, 2003.

After the output intensity of the sound chip is controlled and the wave file prepared based on the equal loudness contour of ISO226 is stored as described above, self-calibration is performed to determine the optimal test start sound for approximate assumption of left and right auditory thresholds.

In case of self-calibration, the original AC97 output intensity level is 100 (based on the maximum output level value of 10000, see Table 1). At this time, the wave file first called from the sound source memory 202 by the controller 200 is 1 kHz, 50 dBHL (reference sound).

In the audiogram test according to the present invention, if the user does not hear the reference sound, the test sound higher than the previous test sound by 10 dBHL is suggested. To this end, the controller 200 changes the AC97 output intensity level from 100(64 dB SPL) to 10000(104 dB SPL). In this case, the test sound higher than the first test sound by 40 dB is provided. Then, the controller 200 calls a wave file of 1 kHz, 20 dBHL. If the output level is changed from 100 to 10000 as above to output a file of 20 dBHL, a sound having the intensity of 60 dB higher than the reference sound by 10 dBHL is given to the user. If the user does not answer to the sound of 60 dBHL, the controller 200 outputs the sound source of 30 dBHL in a state that the output level is maintained at 10000, so that the user can hear the sound of 70 dBHL.

If the user does not recognize the sound, the controller 200 gives the sound to the user while increasing the intensity of the sound by 10 dBHL. The controller 200 determines the sound corresponding to the first answering signal of the user as the start sound and stores the start sound in the memory 210.

Meanwhile, if the user generates the answering signal to the sound of 1 kHz, 50 dBHL output at the first output level of 100, the controller 200 calls the sound source of 40 dBHL (frequency of 1 kHz) from the sound source memory 202 without changing the output level. If the answering signal to the sound source of 40 dBHL is not received, the controller 200 determines the sound source as the start sound. By contrast, if the answering signal to the sound source of 40 dBHL is received, the controller 200 outputs the sound source of 30 dBHL (frequency of 1 kHz) without changing the output level. The controller 200 repeatedly performs the step of determining the start sound or the step of lowering the intensity of the test sound.

As described above, the controller 200 performs self-calibration that determines the start sound by differently outputting the test sound at a step of 10 dBHL depending on whether the user has recognized the test sound. Therefore, the step of determining the start sound can be shortened.

In other words, in the related art audiogram test method, inconvenient manual manipulation of the tester has been essentially required to determine the test start sound. However, in the present invention, the output intensity of the sound chip is controlled at a step of 10 dB and the optimal test start sound can easily be found by changing the output level of the controller 200. Therefore, in the present invention, the audiogram test time can remarkably be reduced.

Although it has been described that AC97 is used as the sound chip and the wave file is used as the sound source file, the present invention is not limited to such case.

Random Bekesy Tracing Algorithm

In the present invention, after self-calibration is performed, the Random Bekesy tracing algorithm is used in testing audiogram.

The Random Bekesy tracing algorithm in testing audiogram is to provide a pure tone and test audiogram depending on whether a testee answers to the pure tone. However, as described above, in the related art audiogram test method (Bekesy method), the intensity of the test sound is only controlled and the controlled intensity of the test sound is given to the testee in a state that the tester previously sets a frequency band. If the auditory threshold is finally determined in the corresponding frequency band, the next frequency band is set. In this way, the same steps are repeatedly performed. In this case, it takes much time to test audiogram, and adaptation and selective attention occur in the test frequency band so as not to obtain the reliable test result.

Particularly, left and right audiograms of 34 bands are tested based on the related art Bekesy tracing algorithm, the expenditure of time has occurred in that it takes three hours.

In the present invention, the controller 200 provides the test sound by differently setting the frequency band based on a predetermined algorithm during the audiogram test without manipulation of the user. Then, the Random Bekesy tracing algorithm is used to determine the auditory threshold in a particular frequency band depending on whether the user receives the test sound.

In more detail, as described above, if the test start sound determined by self-calibration is stored in the memory 210, the controller 200 calls a sound (first test sound) of 1 kHz from the sound source memory 202 and provides the user with the sound. In this case, the sound corresponds to the intensity higher than that of the prior start sound by a predetermined value of 0 dBHL to 15 dBHL. Preferably, a predetermined value of 15 dBHL is used for exact audiogram test.

For example, if the first test sound is provided at the intensity higher than that of the start sound by 15 dBHL, the controller 200 outputs a test sound (second test sound) smaller or greater than the first test sound by 5 dBHL depending on response of the testee.

At this time, the controller 200 calls the second test sound of a frequency band from the sound source memory 202, the frequency band being different from 1 kHz that is a frequency band of the first test sound.

Afterwards, the step of varying the sound source intensity of the test sound by 5 dBHL depending on response of the user is repeated. If an ascending threshold and a descending threshold of the auditory threshold are determined per predetermined frequency band, the controller 200 determines a point corresponding to 2.5 dBHL of the ascending threshold and the descending threshold as the auditory threshold at the frequency band.

If the auditory threshold is determined as above, the controller 200 controls the output of the equalizer 212 to play the sound based on audiogram of the user.

Meanwhile, although not shown, the equalization apparatus according to the present invention may be provided with a user interface portion that can select the number of frequency bands for determining the auditory threshold. Therefore, the user can select the number of frequency bands to be tested, and the controller 200 can determine the auditory threshold depending on the selected frequency band.

As described above, since the controller 200 of the present invention randomly changes the frequency band of each test sound and calls the changed frequency band from the sound source memory 202, the user's manipulation for changing the frequency is not required. Also, it is possible to avoid distortion of audiogram due to adaptation and selective attention of the testee in the related art Bekesy tracing algorithm in which audiogram is tested by varying only the intensity of the sound at one frequency band.

Figure 3:
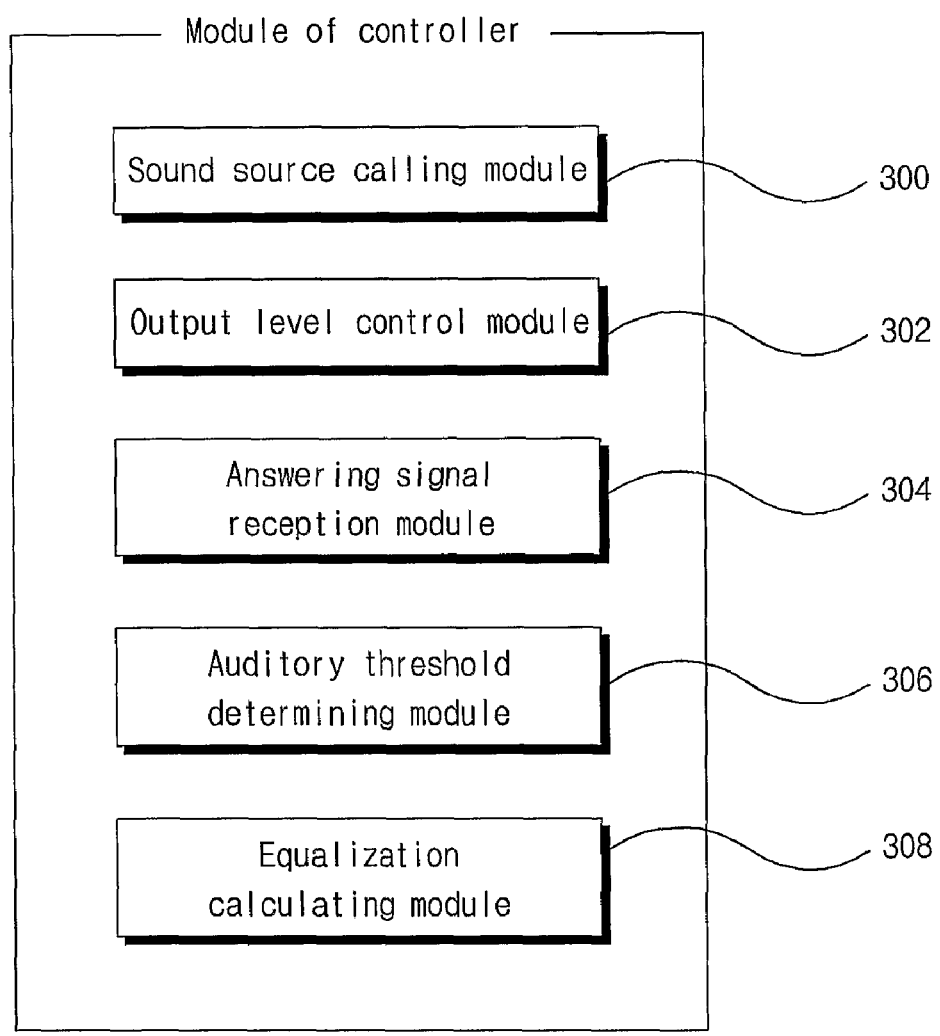
FIG. 3 illustrates a module of a controller according to the preferred embodiment of the present invention.

FIG. 3 illustrates a module of the controller according to the preferred embodiment of the present invention.

As shown in FIG. 3, the controller 200 of the present invention includes a sound source calling module 300, an output level control module 302, an answering signal reception module 304, an auditory threshold determining module 306, and an equalization calculating module 308.

The sound source calling module 300 outputs a reference sound (e.g., 1 kHz, 50 dBHL) and a test sound previously set depending on response of the user from the sound source memory 202 if the audiogram test start signal of the user is received thereto.

Particularly, the sound source calling module 300 outputs the sound source having the intensity different from that of the prior test sound depending on response of the test sound of the user in the step of determining the auditory threshold and calls the test sound of a frequency band from the sound source memory 202, the frequency band being different from a prior frequency band given to the user.

The output level control module 302 controls the output level of the sound chip during self-calibration.

In the present invention, to provide the test sound having no distortion based on the equal loudness contour of ISO226: 2003, the sound source data is stored at a step of 2.5 dBHL using a wave file of 50 dBHL as a maximum value. As described above, the sound source of the reference sound of 1 kHz, 50 dBHL (based on the maximum output level of 10000) is called using the first output level of 100 in case of self-calibration.

However, if the answering signal of the user to the reference sound is not received, a sound higher than the prior sound by 10 dBHL is required. Since the source sound file of 60 dBHL does not exist, the output level control module 302 controls the output level to 10000 to provide such a test sound. The sound source calling module 300 calls the sound source of 1 kHz, 20 dBHL to provide the user with the test sound of 60 dBHL.

The answering signal reception module 304 receives the answering signal of the user who has recognized the test sound, which is output through the answering switch 208. Then, the answering signal reception module 304 transmits the received answering signal to the sound source calling module 300 or the output level control module 302.

Furthermore, if the answering signal of the user is not received for a predetermined time after the test sound is provided, the answering signal reception module 304 determines such no-answering signal to the sound source calling module 300 or the output level control module 302.

The sound source calling module 300 and the output level control module 302 call different sound source data or control the output level depending on the signal transmitted from the answering signal reception module 304.

The auditory threshold determining module 306 determines the ascending threshold and the descending threshold per frequency band depending on response of the user to the test sound whose intensity is controlled by 5 dBHL (frequency is randomly changed). The auditory threshold determining module 306 determines a middle value between the ascending threshold and the descending threshold as the final auditory threshold of the corresponding frequency band.

Figure 4:
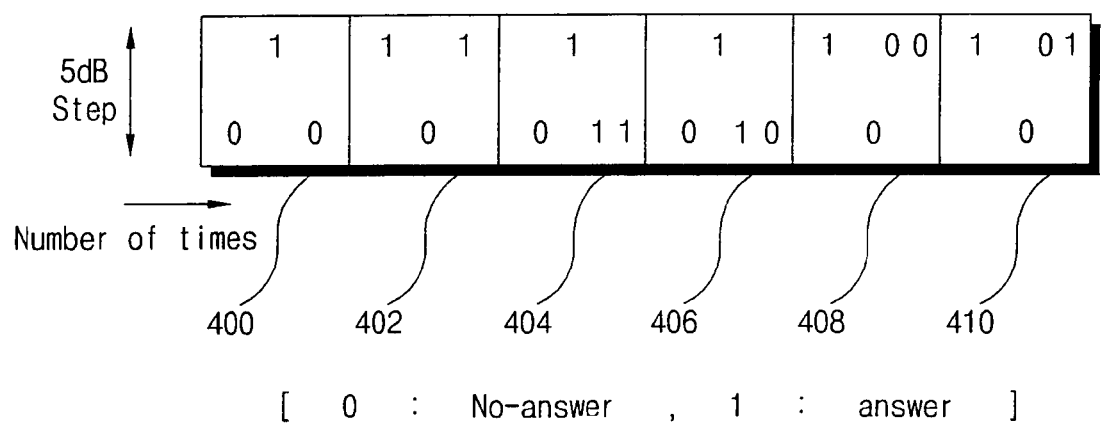
FIG. 4 illustrates the standard for determining a final auditory threshold according to the preferred embodiment of the present invention.

FIG. 4 illustrates the standard for determining the final auditory threshold according to the preferred embodiment of the present invention. As shown in FIG. 4, the auditory threshold determining module 306 can determine the auditory threshold per frequency band depending on six standards.

In FIG. 4, a vertical line represents a step of 5 dBHL, a horizontal line represents the number of test sounds, 0 represents answering, and 1 represents no-answering.

In more detail, a first example 400 represents no-answer(0), answer(1), and no-answer(0) in order. If the first test sound of 30 dBHL is provided at a frequency band of 250 Hz, the first example 400 represents no-answer(0). If the test sound is greater than the prior test sound by 5 dBHL (35 dBHL), the first example 400 represents answer(1). If the test sound is lower than the prior test sound by 5 dBHL (30 dBHL), the first example 400 represents no-answer(0). The auditory threshold determining module 306 stores data on the answering signal of the user in the memory 210 with each frequency and intensity. At the frequency band of 250 Hz, the descending threshold is determined as 30 dBHL, the ascending threshold is determined as 35 dBHL, and the final auditory threshold is determined as 32.5 dBHL.

The test sounds of 30 dBHL, 35 dBHL, and 32.5 dBHL are randomly(not successively) provided to the user during the audiogram test depending on the Random Bekesy tracing algorithm.

A second example 402 represents answer(1), no-answer(0), and answer(1) at a particular frequency band. At this time, the auditory threshold determining module 306 determines the middle value among the test sounds in case of answer(1) and no-answer(0), and answer(1) as the final auditory threshold.

A third example 404 represents no-answer(0), answer(1), and answer(1). In the third example, the user who does not respond to the first test sound at least twice responds to the test sound having the same intensity as that of the first test sound.

In this case, the auditory threshold determining module 306 determines the test sound lower than the final test sound by 2.5 dBHL as the final auditory threshold.

In a fourth example 406, the user irregularly represents answer(1) and no-answer(0) to the test sound equal to the first test sound without responding to the first test sound. In this case, the auditory threshold determining module 306 determines the final test sound as the descending threshold and determines the value greater than the descending threshold by 2.5 dBHL as the final auditory threshold.

Meanwhile, in a fifth example 408, the user responds to the first test sound but does not respond to the next test sound having the same intensity as that of the first test sound at least twice. In this case, the auditory threshold determining module 306 determines the test sound greater than the final test sound by 2.5 dBHL as the final auditory threshold.

Finally, in a sixth example 410, the user responds to the first test sound twice among three times. In this case, the auditory threshold determining module 306 determines the first test sound as the ascending threshold and determines the test sound lower than the first test sound by 2.5 dBHL as the final auditory threshold.

The aforementioned six determining standards include all of possible cases, and audiogram test subject to the Random Bekesy tracing algorithm is available in accordance with the standards.

If the auditory threshold per frequency band is determined by the auditory threshold determining module 306 as described above, the equalization calculating module 308 performs equalization based on the final auditory threshold.

Since the equalizer is well known, its description will be omitted in the present invention.

Figure 5:
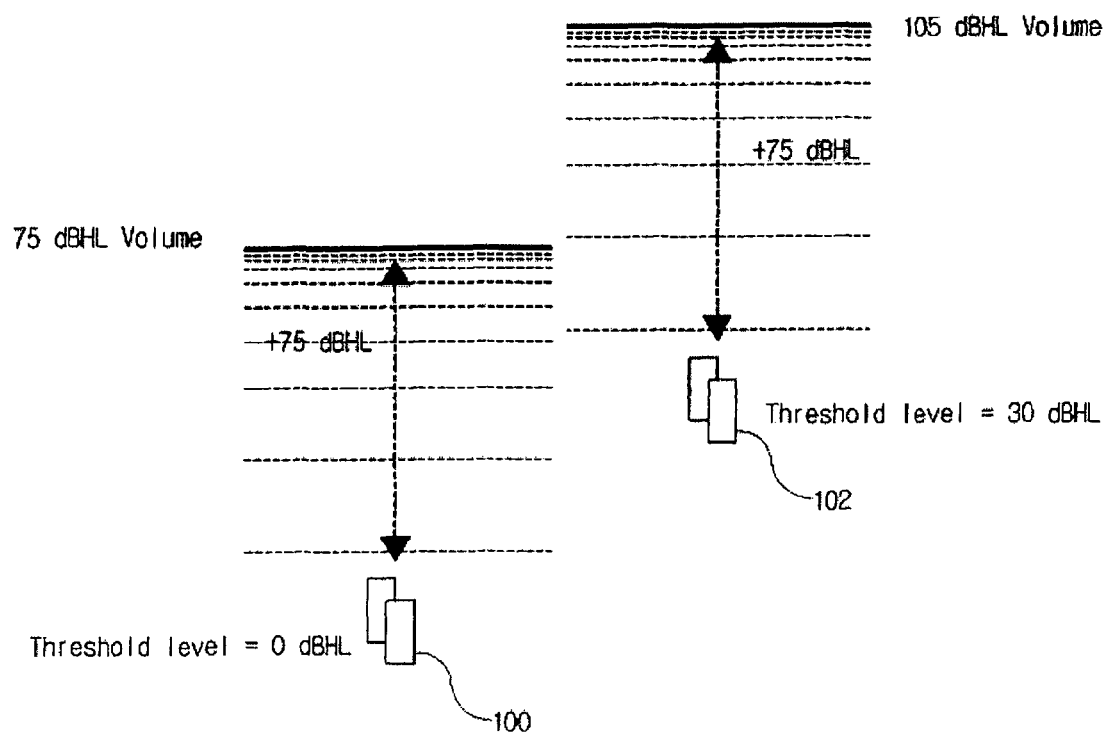
FIG. 5 illustrates the result of volume control of an audio player in which equalization based on audiogram is performed according to the preferred embodiment of the present invention.

FIG. 5 illustrates the result of volume control of the audio player in which equalization based on audiogram is performed according to the preferred embodiment of the present invention. The result of volume control of FIG. 5 will be described in comparison with that of FIG. 1.

In volume control of the related art audio player, since volume control is linearly performed, for example, volume is increased to 90 dBHL at all the frequency bands (see FIG. 1), distortion of sound and fatigue may occur in a particular auditory cell (first group 100). However, in the present invention, since volume control is performed after equalization, volume control in the range of 75 dBHL can be performed respectively in the first group 100 and the second group 102. In this case, cell groups susceptible to intensity are protected while cell groups less susceptible to intensity may be provided with sound of stronger intensity to allow the user to listen to a desired sound.

Figure 6:
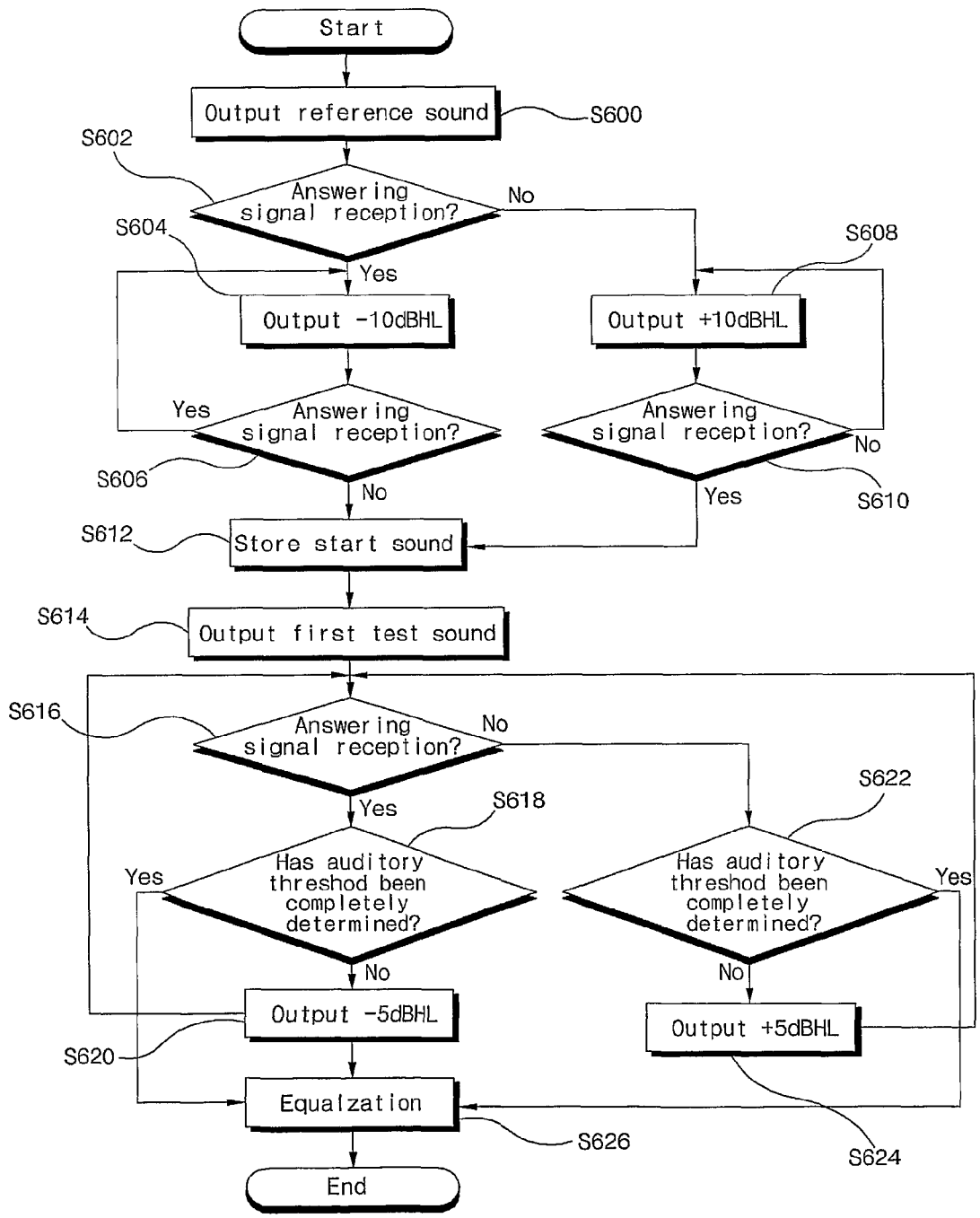
FIG. 6 is a flow chart illustrating equalization based on audiogram according to the preferred embodiment of the present invention.

FIG. 6 is a flow chart illustrating equalization based on audiogram according to the preferred embodiment of the present invention.

Referring to FIG. 6, the controller 200 outputs a reference sound of 1 kHz, 50 dBHL in step S600, and determines whether the answering signal of the user to the reference sound is received in step S602. If the answering signal is received, the controller 200 outputs a sound having intensity lower than that of the reference sound by 10 dBHL in step S604. The controller 200 determines whether the answering signal of the user to the sound of 40 dBHL is received in step S606. If the answering signal is received, the controller 200 repeats the step S604. If the answering signal is not received, the controller 200 determines the test sound at that time as the start sound and stores the test sound in the memory 210 in step S612.

Meanwhile, in step S602, if the answering signal is not received, the controller 200 outputs a sound having intensity higher than that of the reference sound by 10 dBHL in S608. The controller 200 determines whether the answering signal of the user to the sound having intensity higher than that of the reference sound by 10 dBHL is received in step S610. If the answering signal is not received, the controller 200 repeats the step S608. If the answering signal is received, the controller 200 determines the sound at that time as the start sound in step S612.

If the start sound is determined as above, the controller 200 outputs the first test sound having intensity greater than that of the start sound by 15 dBHL in step S614 and determines whether the user responds to the first test sound in step S616.

If the user responds to the first test sound, the controller 200 determines 15 whether all the auditory thresholds have been completely determined per previously set frequency band in S618. If the auditory thresholds have not been completely determined, the controller 200 provides the user with the test sound having intensity lower than that of the prior test sound by 5 dBHL in step S620.

Meanwhile, if the user does not respond to the test sound in step S616, the controller 200 determines whether all the auditory thresholds have been completely determined in step S622. If all the auditory thresholds have not been completely determined, the controller 200 provides the user with the test sound having intensity greater than that of the prior test sound by 5 dBHL in step S624.

As described above, after the test sound controlled at a step of 5 dBHL in comparison with the prior test sound is provided to the user, the steps S618 to S620 or the steps S622 to S624 are repeated depending on whether the answering signal of the user is received.

If all the auditory thresholds are completely determined in the steps S618 and S622, the controller 200 stores the auditory threshold per frequency band in the memory 210 and performs equalization depending on the auditory threshold stored in the memory 210 in step S626.

As described above, the equalization apparatus and method based on audiogram according to the present invention has the following advantages.

Since both the sound chip having the output intensity controlled at a predetermined step and the sound source file based on the equal loudness contour of ISO226:2003 are used, audiogram can exactly be tested and time required for setting the first test sound can be reduced.

Further, since the frequency band is randomly changed during the audiogram test, adaptation or selective attention for a particular frequency band can be removed to determine the exact auditory threshold.

Further, since the audio player is provided in which equalization based on exact and prompt auditory threshold is performed, an optimal sound and an optimal hearing protection function can be given to the user.

Finally, since the auditory threshold is determined per frequency band for volume control, a clear sound can be provided at low power.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

What is claimed is:

1. An equalization method based on audiogram using an equalization apparatus including a sound source memory calibrated at a constant step of dBHL and storing sound source data having a plurality of frequency bands for one dBHL, a sound chip, a controller calling the sound source data, a speaker, and an equalizer, the equalization method comprising the steps of:
   a) outputting a reference sound having reference frequency and intensity for approximate assumption of auditory threshold;
   b) determining a start sound corresponding to an assumed value of the auditory threshold while calling a sound having intensity different from a prior sound at a sound source memory depending on whether an answering signal of a user to the reference sound is received;
   c) outputting a first test sound whose intensity is controlled at a value set prior to the start sound, having the reference frequency;
   d) calling a test sound having intensity and frequency different from those of the prior sound at the sound source memory depending on whether the answering signal of the user to the test sound is received;
   e) storing reception data on the answering signal of the user to the test sound;
   f) repeating the steps d) to e);
   g) determining the auditory threshold per previously set frequency band using the reception data of the answering signal; and
   h) performing equalization depending on the determined auditory threshold per frequency, wherein the controller calls a sound source while randomly changing the frequency depending on a predetermined Random Bekesy tracing algorithm.

2. The equalization method based on audiogram according to claim 1, wherein the sound chip has maximum output intensity and minimum output intensity which are divided at a constant step by an output intensity control algorithm, the output intensity being changed by a predetermined output level, and the sound source memory stores the sound source data calibrated at a step of 2.5 dBHL from 50 dBHL to 0 dBHL (50 dBHL to 0 dBHL mean that intensity of corresponding dBHL is heard at a particular output level).

3. The equalization method based on audiogram according to claim 2, wherein the step b) includes the steps of i) outputting a sound having intensity greater than the prior sound by 10 dBHL if the answering signal of the user to the reference sound is not received, and storing a sound of corresponding intensity if the answering signal is received (the stored sound corresponds to a start sound), and j) outputting a sound having intensity lower than the prior sound by 10 dBHL if the answering signal of the user to the reference sound is not received, and storing a sound of corresponding intensity if the answering signal is not received (the stored sound corresponds to a start sound).

4. The equalization method based on audiogram according to claim 3, wherein the controller calls the sound source data of 1 kHz, 50 dBHL from the sound source memory to output the reference sound of 1 kHz, 50 dBHL to the user at the first output level, and controls the output level at a high level to output a sound having intensity greater than the sound of 50 dBHL if the answering signal of the user to the reference sound is not received in the step i).

5. The equalization method based on audiogram according to claim 1, wherein the first test sound corresponds to a sound having intensity greater than that of the start sound by 15 dBHL, the test sound controlled in the step d) has the intensity difference of 5 dBHL from that of the prior test sound, and the controller determines a final auditory threshold at a band of 2.5 dBHL between an ascending threshold and a descending threshold in a particular frequency band depending on whether the answering signal of the user is received.

6. The equalization method based on audiogram according to claim 1, further comprising the step of determining the number of frequency bands for determining the auditory threshold depending on an input signal of the user, wherein the controller calls the sound source data and determines the auditory threshold to correspond to the number of the determined frequency bands.

7. The equalization method based on audiogram according to claim 6, wherein the number of the frequency bands corresponds to any one of 6 bands, 11 bands, 17 bands, and 34 bands.

8. An equalization apparatus based on audiogram comprising:
   a sound source memory calibrated at a constant step of dBHL and storing sound source data having a plurality of frequency bands for one dBHL;
   a controller calling a reference sound for approximate assumption of user's auditory threshold and a sound source from the sound source memory during audiogram test, the sound source having intensity and/or frequency controlled depending on whether an answering signal of a user is received, storing reception data on the answering signal of the user to determine user's auditory threshold per frequency band, performing equalization depending on the determined auditory threshold;

a sound chip whose output level is controlled at a constant step by an output level control program, receiving an output level changing signal of the controller to change the output level; and an equalizer equalized by the controller, wherein the controller calls the sound source while randomly changing the frequency depending on a predetermined Random Bekesy tracing algorithm.

9. The equalization apparatus based on audiogram according to claim 8, wherein the sound source memory stores a plurality of sound source data having a step of 2.5 dBHL from 50 dBHL to 0 dBHL based on an equal loudness contour of ISO226:2003, and the controller calls the sound source data of 1 kHz, 50 dBHL from the sound source memory to output the reference sound of 1 kHz, 50 dBHL to the user at the first output level and controls the output level at a high level if the test sound given to the user based on the first output level should be greater than 50 dBHL.

* * * * *